US008464123B2

(12) United States Patent
Alrod et al.

(10) Patent No.: US 8,464,123 B2
(45) Date of Patent: Jun. 11, 2013

(54) MATRIX STRUCTURE FOR BLOCK ENCODING

(75) Inventors: Idan Alrod, Herzliya (IL); Eran Sharon, Rishon Lezion (IL); Simon Litsyn, Givat Shmuel (IL)

(73) Assignee: Ramot At Tel Aviv University Ltd., Tel Aviv (IL)

( * ) Notice: Subject to any disclaimer, the term of this patent is extended or adjusted under 35 U.S.C. 154(b) by 435 days.

(21) Appl. No.: 12/774,746

(22) Filed: May 6, 2010

(65) Prior Publication Data

US 2010/0287440 A1   Nov. 11, 2010

Related U.S. Application Data

(60) Provisional application No. 61/176,123, filed on May 7, 2009.

(51) Int. Cl.
*H03M 13/00* (2006.01)
(52) U.S. Cl.
USPC ........... 714/752; 714/746; 714/751; 714/790; 714/800; 714/801; 714/802
(58) Field of Classification Search
None
See application file for complete search history.

(56) References Cited

U.S. PATENT DOCUMENTS

| | | | |
|---|---|---|---|
| 6,895,547 B2 | 5/2005 | Eleftheriou et al. | |
| 7,237,174 B2 | 6/2007 | Eroz et al. | |
| 7,313,752 B2 | 12/2007 | Kyung et al. | |
| 7,363,570 B2 | 4/2008 | Kim et al. | |
| 7,388,781 B2 | 6/2008 | Litsyn et al. | |
| 7,461,325 B2 | 12/2008 | Eroz et al. | |
| 8,225,168 B2 * | 7/2012 | Yu et al. ........................ 714/752 |
| 2003/0037298 A1 | 2/2003 | Eleftheriou et al. | |
| 2004/0019845 A1 | 1/2004 | Eroz et al. | |
| 2004/0123229 A1 | 6/2004 | Kim et al. | |
| 2004/0148556 A1 | 7/2004 | Hagh et al. | |
| 2005/0050435 A1 | 3/2005 | Kyung et al. | |
| 2005/0066262 A1 | 3/2005 | Eroz et al. | |
| 2005/0268202 A1 | 12/2005 | Molisch et al. | |
| 2007/0124652 A1 | 5/2007 | Litsyn et al. | |
| 2007/0229329 A1 | 10/2007 | Maru | |

(Continued)

FOREIGN PATENT DOCUMENTS

AU   2003/242710 A1   1/2004
EP   1 385 270 B1   5/2007

(Continued)

OTHER PUBLICATIONS

U.S. Appl. No. 60/939,092, filed May 21, 2007.

(Continued)

*Primary Examiner* — John Trimmings
(74) *Attorney, Agent, or Firm* — Alston & Bird LLP

(57) ABSTRACT

A plurality of information bits are encoded using a parity-check matrix that is equivalent to a modular code matrix. The modular code matrix is a diagonal sub-matrix structure immediately above a connection layer that includes a plurality of diverse connection layer sub-matrices, all but at most one of which are below corresponding diagonal matrix structure sub-matrices. The information bits are assembled with a plurality of parity bits produced by the encoding to provide a codeword that is exported to a medium. Preferably, all the diagonal matrix structure sub-matrices are identical. Preferably, some of the parity bits are computed using only diagonal matrix structure sub-matrices.

26 Claims, 10 Drawing Sheets

U.S. PATENT DOCUMENTS

| | | | |
|---|---|---|---|
| 2007/0234179 A1 | 10/2007 | Eroz et al. | |
| 2007/0283221 A1 | 12/2007 | Kyung et al. | |
| 2008/0082895 A1 | 4/2008 | Eroz et al. | |
| 2008/0168334 A1* | 7/2008 | Gribok et al. | 714/781 |
| 2008/0235559 A1 | 9/2008 | Yang | |
| 2008/0256426 A1 | 10/2008 | Reid et al. | |
| 2008/0294960 A1 | 11/2008 | Sharon et al. | |
| 2009/0044081 A1 | 2/2009 | Eroz et al. | |
| 2009/0327847 A1* | 12/2009 | Shen et al. | 714/804 |
| 2010/0122140 A1* | 5/2010 | Shen et al. | 714/752 |
| 2012/0192029 A1* | 7/2012 | Shen et al. | 714/752 |

FOREIGN PATENT DOCUMENTS

| | | |
|---|---|---|
| WO | WO 2004/004134 A1 | 1/2004 |
| WO | WO 2004/062112 A2 | 7/2004 |
| WO | WO 2005/020500 A1 | 3/2005 |
| WO | WO 2007/080827 A1 | 7/2007 |
| WO | WO 2007/089165 A1 | 8/2007 |

OTHER PUBLICATIONS

Mansour, Mohammad and Shanbhag, Naresh R.; "Memory-Efficient Turbo Decoder Architechtures for LDPC Codes"; IEEE 2002; pp. 159-164.

Technical Description of Turbo Product Codes; Efficient Channel Coding, Inc.; Version 4.0; Jun. 1999; 11 pages.

* cited by examiner

FIGURE 4

| | V01 | V05 | V04 | V12 | V09 | V07 | V11 | V16 | V6 | V03 | V02 | V14 | V17 | V13 | V15 | V8 | V10 | V18 |
|---|---|---|---|---|---|---|---|---|---|---|---|---|---|---|---|---|---|---|
| C3 | 1 | 1 | 0 | 1 | 1 | 0 | 0 | 0 | 0 | 0 | 0 | 0 | 0 | 0 | 0 | 0 | 0 | 0 |
| C8 | 1 | 1 | 1 | 0 | 0 | 1 | 1 | 1 | 0 | 1 | 0 | 0 | 0 | 0 | 0 | 0 | 0 | 0 |
| C1 | 0 | 0 | 0 | 0 | 0 | 0 | 1 | 1 | 1 | 1 | 1 | 0 | 0 | 0 | 0 | 0 | 0 | 0 |
| C6 | 0 | 0 | 0 | 0 | 0 | 0 | 1 | 0 | 1 | 0 | 0 | 1 | 1 | 1 | 1 | 1 | 0 | 0 |
| C5 | 0 | 0 | 0 | 0 | 0 | 0 | 0 | 0 | 0 | 0 | 0 | 0 | 1 | 1 | 0 | 0 | 1 | 1 |
| C9 | 0 | 0 | 1 | 1 | 0 | 0 | 0 | 0 | 0 | 1 | 1 | 0 | 0 | 0 | 0 | 0 | 0 | 1 |
| C2 | 0 | 0 | 0 | 0 | 1 | 1 | 0 | 0 | 0 | 0 | 0 | 1 | 0 | 0 | 1 | 0 | 1 | 0 |
| C7 | 0 | 0 | 0 | 0 | 0 | 1 | 0 | 0 | 1 | 0 | 1 | 0 | 0 | 0 | 1 | 1 | 0 | 1 |
| C4 | 0 | 0 | 0 | 0 | 1 | 0 | 0 | 0 | 1 | 0 | 0 | 1 | 0 | 0 | 0 | 1 | 0 | 0 |

FIGURE 6

| | V01 | V05 | V04 | V12 | V09 | V07 | V11 | V16 | V06 | V03 | V02 | V14 | V13 | V17 | V15 | V08 | V10 | V18 | V19 | V20 | V21 | V22 | V23 |
|---|---|---|---|---|---|---|---|---|---|---|---|---|---|---|---|---|---|---|---|---|---|---|---|
| C3 | 1 | 1 | 0 | 1 | 1 | 0 | 0 | 0 | 0 | 0 | 0 | 0 | 0 | 0 | 0 | 0 | 0 | 0 | 0 | 0 | 0 | 0 | 0 |
| C8 | 1 | 1 | 1 | 0 | 0 | 1 | 1 | 1 | 0 | 0 | 0 | 0 | 0 | 0 | 0 | 0 | 0 | 0 | 0 | 0 | 0 | 0 | 0 |
| C1 | 0 | 0 | 0 | 0 | 0 | 0 | 1 | 1 | 1 | 1 | 0 | 0 | 0 | 0 | 0 | 0 | 0 | 0 | 0 | 0 | 0 | 0 | 0 |
| C6 | 0 | 0 | 0 | 0 | 0 | 0 | 0 | 1 | 0 | 0 | 0 | 0 | 1 | 1 | 1 | 1 | 1 | 1 | 0 | 0 | 0 | 0 | 0 |
| C5 | 0 | 0 | 0 | 0 | 0 | 0 | 0 | 0 | 0 | 0 | 0 | 1 | 0 | 0 | 1 | 0 | 1 | 0 | 1 | 0 | 1 | 0 | 0 |
| C9 | 0 | 1 | 0 | 0 | 1 | 0 | 0 | 0 | 0 | 0 | 1 | 0 | 0 | 0 | 0 | 0 | 0 | 0 | 1 | 0 | 0 | 0 | 0 |
| C2 | 0 | 0 | 1 | 0 | 0 | 1 | 0 | 0 | 0 | 1 | 0 | 0 | 0 | 1 | 0 | 1 | 0 | 1 | 1 | 0 | 0 | 1 | 1 |
| C7 | 0 | 0 | 0 | 0 | 1 | 0 | 0 | 0 | 1 | 0 | 0 | 0 | 0 | 0 | 0 | 1 | 0 | 1 | 0 | 1 | 0 | 1 | 1 |
| C4 | 0 | 0 | 0 | 0 | 1 | 0 | 0 | 0 | 1 | 0 | 1 | 1 | 0 | 1 | 0 | 0 | 0 | 0 | 0 | 0 | 0 | 0 | 1 |

| | V01 | V05 | V04 | V12 | V09 | V07 | V11 | V16 | V06 | V03 | V02 | V14 | V17 | V13 | V15 | V08 | V10 | V18 | V19 | V20 | V21 | V22 | V23 |
|---|---|---|---|---|---|---|---|---|---|---|---|---|---|---|---|---|---|---|---|---|---|---|---|
| C3 | 1 | 1 | 0 | 1 | 1 | 0 | 0 | 0 | 0 | 0 | 0 | 0 | 0 | 0 | 0 | 0 | 0 | 0 | 0 | 0 | 0 | 0 | 0 |
| C8 | 1 | 1 | 1 | 0 | 0 | 1 | 0 | 0 | 0 | 0 | 0 | 0 | 0 | 0 | 0 | 0 | 0 | 0 | 0 | 0 | 0 | 0 | 0 |
| C1 | 0 | 0 | 0 | 0 | 0 | 0 | 1 | 1 | 0 | 1 | 1 | 0 | 0 | 0 | 0 | 0 | 0 | 0 | 0 | 0 | 0 | 0 | 0 |
| C6 | 0 | 0 | 0 | 0 | 0 | 0 | 1 | 1 | 1 | 0 | 0 | 0 | 0 | 0 | 0 | 0 | 0 | 0 | 0 | 0 | 0 | 0 | 0 |
| C5 | 0 | 0 | 0 | 0 | 0 | 0 | 0 | 0 | 0 | 0 | 0 | 0 | 1 | 1 | 1 | 1 | 1 | 1 | 0 | 0 | 0 | 0 | 0 |
| C9 | 0 | 0 | 0 | 0 | 0 | 0 | 0 | 0 | 0 | 1 | 0 | 0 | 1 | 0 | 0 | 0 | 0 | 0 | 1 | 1 | 1 | 1 | 0 |
| C2 | 0 | 0 | 0 | 1 | 0 | 0 | 0 | 0 | 0 | 0 | 1 | 0 | 0 | 0 | 0 | 0 | 1 | 0 | 1 | 1 | 0 | 1 | 1 |
| C7 | 0 | 0 | 0 | 0 | 1 | 1 | 0 | 0 | 0 | 0 | 0 | 0 | 0 | 0 | 0 | 0 | 0 | 1 | 0 | 1 | 0 | 1 | 1 |
| C4 | 0 | 0 | 0 | 0 | 1 | 0 | 0 | 0 | 0 | 0 | 0 | 1 | 0 | 0 | 0 | 1 | 0 | 1 | 0 | 1 | 0 | 0 | 1 |

FIGURE 11

MATRIX STRUCTURE FOR BLOCK ENCODING

This patent application claims the benefit of U.S. Provisional Patent Application No. 61/176,123, filed May 7, 2009

FIELD AND BACKGROUND OF THE INVENTION

The present invention relates to encoding and, more particularly, to methods and devices for encoding data using an innovative parity-check matrix structure.

Consider a linear block code defined by a generator matrix Γ. To encode an information vector b, Γ is right-multiplied by b to produce a codeword vector c:

$$c = b\Gamma \quad (1)$$

Associated with Γ are one or more parity-check matrices H that satisfy the matrix equation $$Hc = 0 \quad (2)$$

for all the codeword vectors c of the code, i.e. a vector c belongs to the code if the vector satisfies equation (2). Typically, Γ, H and c are defined over the field GF(2), i.e. the elements of Γ, H and c are 0 or 1, and the addition of field elements is done as integer addition modulo 2.

A LDPC code is a linear binary block code whose parity-check matrix or matrices H is/are sparse. As shown in FIG. 1, a LDPC parity check matrix H is equivalent to a sparse bipartite "Tanner graph" G=(V,C,E) with a set V of N bit nodes (N=13 in FIG. 1), a set C of M check nodes (M=10 in FIG. 1) and a set E of edges (E=38 in FIG. 1) connecting bit nodes to check nodes. The bit nodes correspond to the codeword bits and the check nodes correspond to parity-check constraints on the bits. A bit node is connected by edges to the check nodes that the bit node participates with. In the matrix representation (matrix H of equation (2)) of the code on the left side of FIG. 1 an edge connecting bit node i with check node j is depicted by a non-zero matrix element at the intersection of row j and column i.

Next to the first and last check nodes of FIG. 1 are shown the equivalent rows of equation (1). The symbol "⊕" means "XOR".

A node degree is the number of edges emanating from the node. A variable node degree is equal to the number of 1's in the corresponding column of H (it is also called a column degree). A check node degree is equal to the number of 1's in the corresponding row of H (it is also called the row degree). We denote by $d_v$ the average variable nodes degree (or the average number of 1's in a column) and by $d_c$ the average check nodes degree (or the average number of 1's in a row).

LDPC codes can be decoded using iterative message passing decoding algorithms. These algorithms operate by exchanging messages between bit nodes and check nodes along the edges of the underlying bipartite graph that represents the code.

The decoder is provided with initial estimates of the codeword bits (based on the communication channel output or based on the read memory content). These initial estimates are refined and improved by imposing the parity-check constraints that the bits should satisfy as a valid codeword (according to equation (2)). This is done by exchanging information between the bit nodes representing the codeword bits and the check nodes representing parity-check constraints on the codeword bits, using the messages that are passed along the graph edges.

In iterative decoding algorithms, it is common to utilize "soft" bit estimations, which convey both the bit estimations and the reliabilities of the bit estimations.

The bit estimations conveyed by the messages passed along the graph edges can be expressed in various forms. A common measure for expressing a "soft" estimation of a bit v is as a Log-Likelihood Ratio (LLR)

$$\log \frac{Pr(v = 0 \mid \text{current constraints and observations})}{Pr(v = 1 \mid \text{current constraints and observations})},$$

where the "current constraints and observations" are the various parity-check constraints taken into account in computing the message at hand and observations, such as the sequence of symbols received from a communication channel, corresponding to the bits participating in these parity checks. The sign of the LLR provides the bit estimation (i.e., positive LLR corresponds to v=0 and negative LLR corresponds to v=1). The magnitude of the LLR provides the reliability of the estimation (i.e., |LLR|=0 means that the estimation is completely unreliable and |LLR|=±∞ means that the estimation is completely reliable and the bit value is known).

The standard method for encoding linear block codes is based on the code's generator matrix Γ, which is composed of a set of basis vectors spanning the code's linear subspace. The code's generator matrix Γ is related to its parity-check matrix H through the following equation:

$$\Gamma H^T = 0 \quad (3)$$

Hence, knowing one matrix determines the other. Note that for LDPC codes even though the parity-check matrix H is sparse the generator matrix Γ is not sparse (i.e. Γ has around 50% non zero elements). As noted above, encoding a sequence b of information bits into a codeword c is done as shown in equation (1). If Γ is K×N and not sparse, the complexity of this encoding procedure is ~K/2×N=O(N²), which is quite high. Moreover the storage complexity of the matrix Γ is ~K/2×N=O(N²). Fortunately, for LDPC codes a much simpler encoding procedure can be used by taking advantage of the sparse nature of the code's parity-check matrix. Indeed, for LDPC codes encoding is performed based on equation (2) and not based on equation (1). Assume that the code is systematic, i.e. that the first K bits in the codeword c are equal to the information bit sequence b and that the last M bits are the redundant parity bits, denoted as p. Then, the encoding procedure reduces to finding the bit sequence p such that the following equations hold:

$$Hc = H \cdot \begin{bmatrix} b \\ p \end{bmatrix} = 0 \quad (4)$$

This problem is easy to solve if we limit the last 'M' columns of the parity-check matrix H to be a lower triangular matrix as shown in FIG. 2. Based on this matrix structure parity bits can be recovered one after another by applying a Gaussian elimination procedure on the set of equations described by equation (4). The procedure is based on the following observation: whenever we have a parity-check in which only a single bit is unknown, then this bit can be recovered as a XOR of the rest of the bits in the parity-check. Hence, due to the lower triangular form of the parity-check matrix, if we pass over its parity-checks, one by one from top to bottom, then we can recover all of the parity bits. Each parity bit is computed by XORing an average of $d_c$−1 already known bits. Hence, the encoding complexity is reduced to $M \cdot (d_c-1) = N \cdot (1-R) \cdot (d_c-1) = O(N)$. Note that $d_c$ is a small constant (independent of 'N') due to the fact that the parity-check matrix is sparse. Furthermore, since encoding is performed using the sparse parity-check matrix H, there is no need to store the dense generator matrix $\Gamma$.

A basic property of LDPC codes (and error correction codes in general) is that the error correction capability for the same code rate improves as the code length N increases. Moreover, the error floor effect in LDPC codes reduces as the code length increases. Unfortunately, the code's Encoder/Decoder complexity is proportional to the number of edges |E| in the bipartite graph representing the code, which is proportional to the code length $|E|=d_v \cdot N$.

It would be highly advantageous to have a code structure amenable to efficient, low-complexity and low-power encoding and decoding algorithms. Such a structure would allow for approaching the theoretical capacity limit of a memory such as a flash memory using a low complexity controller.

Definitions

The methodology described herein is applicable to encoding and decoding in at least two different circumstances. One circumstance is the storing of data in a storage medium, followed by the retrieving of the data from the storage medium. The other circumstance is the transmitting of data to a transmission medium, followed by the receiving of the data from the transmission medium. Therefore, the concepts of "storing" and "transmitting" of data are generalized herein to the concept of "exporting" data. Both "storing" data and "transmitting" data thus are special cases of "exporting" data.

The usual instantiation of a storage medium is as a memory such as a flash memory. The usual instantiation of a transmission medium is as a communication channel.

"Encoding" is understood herein to mean turning an information vector ("b" in equation (1)) into a codeword ("c" in equation (1)).

SUMMARY OF THE INVENTION

One embodiment provided herein is a method of encoding and exporting a plurality of information bits, including: (a) providing a parity-check matrix that is equivalent to a modular code matrix that consists of a diagonal sub-matrix structure, including a plurality of diagonal structure sub-matrices, immediately above a connection layer that includes a plurality of diverse connection layer sub-matrices, with all but at most one of the connection layer sub-matrices being below corresponding diagonal structure sub-matrices; (b) using the information bits and the parity-check matrix to compute a plurality of parity bits; (c) assembling the information bits and the parity bits to form a codeword; and (d) exporting at least a portion of the codeword to a medium.

Another embodiment provided herein is an apparatus for encoding and exporting a plurality of information bits, including: (a) an encoder for encoding the plurality of information bits by: (i) using the information bits and a parity-check matrix to compute a plurality of parity bits, wherein the parity-cheek matrix is equivalent to a modular code matrix that consists of a diagonal sub-matrix structure, including a plurality of diagonal structure sub-matrices, immediately above a connection layer that includes a plurality of diverse connection layer sub-matrices, with all but at most one of the connection layer sub-matrices being below corresponding diagonal structure sub-matrices, and (ii) assembling the information bits and the parity bits to form a codeword; and (b) a mechanism for exporting at least a portion of the codeword to a medium.

Another embodiment provided herein is a computer-readable storage medium having embodied thereon computer-readable code for managing a memory, the computer-readable code including: (a) program code for using a parity-check matrix to compute a plurality of parity bits, wherein the parity-check matrix is equivalent to a modular code matrix that consists of a diagonal sub-matrix structure, including a plurality of diagonal structure sub-matrices, immediately above a connection layer that includes a plurality of diverse connection layer sub-matrices, with all but at most one of the connection layer sub-matrices being below corresponding diagonal structure sub-matrices; (b) program code for assembling the information bits and the parity bits to form a codeword; and (c) program code for storing the codeword in the memory.

A basic embodiment of a method for encoding and exporting a plurality of information bits uses a parity-check matrix to encode the information bits as a codeword that includes both the information bits and a plurality of parity bits. The parity-cheek matrix is a matrix that is "equivalent" to a modular code matrix that has the structure illustrated in equation (5) below or in equation (7) below: a diagonal sub-matrix structure immediately above a connection layer. The diagonal sub-matrix structure is a matrix, all of whose elements are 0 except for a set of n>1 non-zero sub-matrices $A_i$ (i=1, ..., n) that are arranged diagonally: the first element (element (1,1)) of $A_1$ is element (1,1) of the diagonal sub-matrix structure, and for the rest of the $A_i$, if the last element of $A_{i-1}$ (element (J,K) if $A_{i-1}$ is J×K) is element (j,k) of the diagonal sub-matrix structure then the first element of $A_i$ is element (j+1,k+1) of the diagonal sub-matrix structure. (A "non-zero" matrix is a matrix with at least one non-zero element.) The last row of $A_n$ is on the last row of the diagonal sub-matrix structure but the last element of $A_n$ is not necessarily the last element of the diagonal sub-matrix structure. The connection layer is a layer of n or n+1 contiguous, diverse, non-zero connection layer sub-matrices $B_i$ that all have the same number of rows. That the connection layer sub-matrices are "diverse" means that they are not all identical. All but at most one of the connection-layer sub-matrices are below respective corresponding diagonal structure sub-matrices: $B_1$ is below $A_1$, $B_2$ is below $A_2$, etc. That $B_i$ is "below" $A_i$ means that $A_i$ and $B_i$ share the same columns of the modular code matrix. (Note that the permutations defined in equations (8) and (9) below may change the relative positions of the matrix elements of $A_i$ and $B_i$ in the actual parity-check matrix. Nevertheless, in the modular code matrix itself, $B_i$ is below $A_i$.)

That the parity-check matrix is "equivalent" to the modular code matrix means that the parity-check matrix either is identical to the modular code matrix or is obtained from the modular code matrix by one of the methods described below: by left-multiplying and right-multiplying the modular code matrix by permutation matrices R and Q as in equation (8) below, by left multiplying the modular code matrix by a matrix R that is invertible over the field GF(2) and right multiplying the modular code matrix by a permutation matrix Q mod (2), as in equation (9) below, or by embedding a matrix that is otherwise equivalent to the modular code matrix in a larger matrix.

The information bits and the parity check matrix are used to compute the parity bits. The information bits and the parity bits are assembled to form the codeword. Usually, this assembly is performed by concatenating the information bits and the parity bits. Finally, at least a portion of the codeword is exported to a medium such as a storage medium or a transmission medium.

Preferably, all the diagonal structure sub-matrices $A_i$ are identical.

Preferably, the number of non-zero elements in each diagonal structure sub-matrix $A_i$ is at most a predefined fraction of the total number of elements of $A_i$.

Preferably, a portion of the parity bits is computed using only some or all of the diagonal structure sub-matrices but not using any of the connection layer sub-matrices. Most preferably, of the diagonal structure sub-matrices that are used to compute that portion of the parity bits, each such diagonal structure sub-matrix is used separately to compute only a respective at least one of the parity bits.

In some embodiments of the method, every connection layer sub-matrix is below a corresponding diagonal structure sub-matrix. In other embodiments, every connection layer sub-matrix except for the rightmost connection layer sub-matrix is below a corresponding diagonal structure sub-matrix.

Preferably, each connection layer sub-matrix is of the form [IZ]Q, where I is an identity matrix, Z is a matrix of all zeros, and Q is a pseudo-random permutation matrix, as in equation (6) below. The notation "[IZ]Q" means that the matrices I and Z are concatenated and then right-multiplied by the matrix Q.

Preferably, the connection layer sub-matrices have non-zero elements only in pre-defined columns of the modular code matrix. More preferably, those pre-defined columns correspond to at least a portion of the parity bits. Most preferably, the pre-defined columns correspond to only a portion of the parity bits, and all of the codeword except for that portion of the parity bits is exported to the medium. In other words, the parity bits, to which the pre-defined columns correspond, are punctured.

A basic apparatus for encoding and exporting a plurality of information bits includes an encoder for encoding the information bits using the basic embodiment of the method and a mechanism for exporting at least a portion of the resulting codeword to the medium. If the medium is a storage medium, then in some embodiments the apparatus is a controller of the storage medium, and an associated memory device includes such a controller and also the storage medium. Alternatively, the apparatus is a host of the storage medium, and an associated system includes the apparatus and the storage medium. If the medium is a transmission medium, then an associated transmitter includes the apparatus. In such a transmitter, preferably, the mechanism for exporting the at least portion of the codeword includes a modulator that transmits the at least portion of the codeword as a modulated signal.

A computer-readable storage medium having embodied therein computer-readable code for managing a memory includes program code for implementing the basic method, with the "exporting" of the codeword being storage of the codeword in the memory. An associated system includes the memory and also a host of the memory that includes the computer-readable storage medium and a processor for executing the computer-readable code.

BRIEF DESCRIPTION OF THE DRAWINGS

Various embodiments are herein described, by way of example only, with reference to the accompanying drawings, wherein:

FIGS. 4 and 6 show modular code matrices corresponding to the Tanner graphs of FIGS. 3 and 5;

FIG. 11 shows a third exemplary modular code matrix.

DESCRIPTION OF THE PREFERRED EMBODIMENTS

Figure 1:
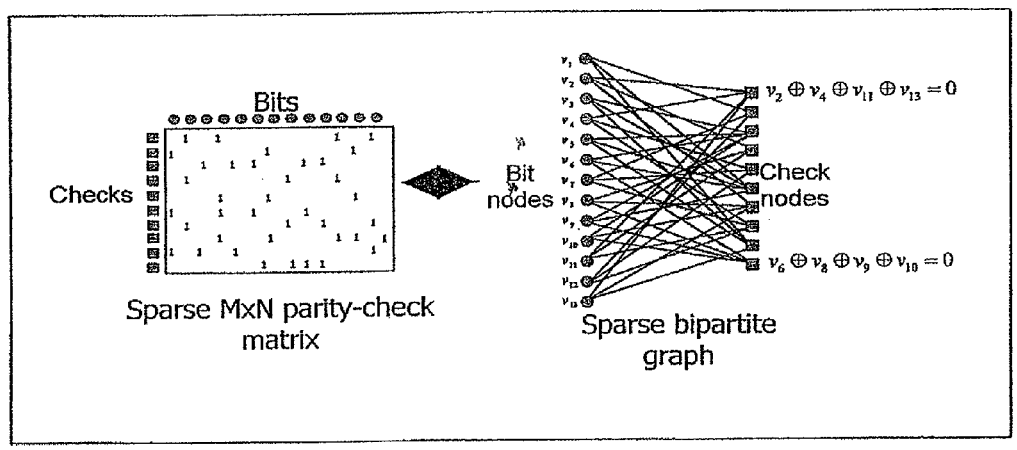
FIG. 1 shows how a LDPC code can be represented as either a sparse parity-check matrix or as a Tanner graph.
Figure 2:
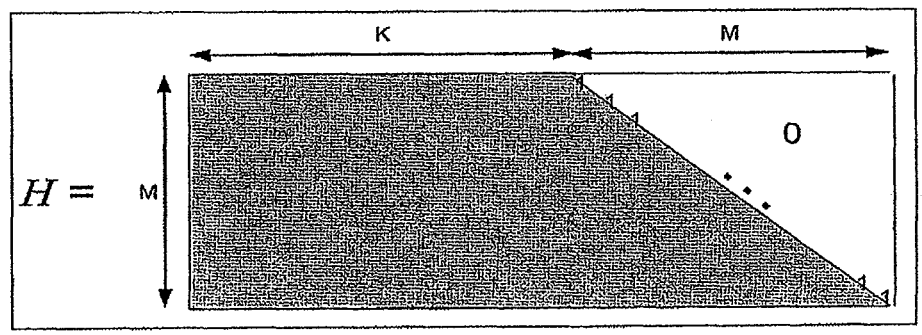
FIG. 2 shows a prior art form of a parity-check matrix that is convenient for encoding.

The principles and operation of low-complexity encoding and decoding may be better understood with reference to the drawings and the accompanying description.

Presented herein is a description of an advanced LDPC encoding and decoding scheme generalized to include also other codes defined by a wider range of parity-check matrices. The encoding and decoding schemes described herein enjoy the full performance of (almost) achieving channel capacity and also apply to a wide range of codes, which can be decoded using low-complexity algorithms.

One prototype parity-check matrix for the encoding scheme described herein has the following form:

$$M = \begin{bmatrix} A & & & \\ & A & & \\ & & \ddots & \\ & & & A \\ B_1 & B_2 & \ldots & B_n \end{bmatrix} \quad (5)$$

The matrix A is a parity-check matrix for a sub-code comprising only a subset of the variables of the code, and the last rows of the matrix M (those corresponding to the matrices $B_i$) contain parity check equations involving variable bits associated with different sub-codes.

A decoder for the code represented by the matrix M may first check the parity conditions corresponding to each sub-code by applying a low-complexity decoder to each sub-code. In case some of the sub-codes do not converge, additional decoding is applied taking into account the relations between the sub-codes defined by the last rows of M. These last rows of M are referred to herein as the "connection layer" of the code and, in the appended claims as the "connection layer" of matrix M. The portion of matrix M above the connection layer is referred to in the appended claims as a "diagonal sub-matrix structure". The matrices A are referred to in the appended claims as "diagonal structure sub-matrices".

Typically, a matrix A is a parity-check matrix of a short LDPC code, while the full matrix M is a parity-check matrix of a long LDPC code. The decoding begins by decoding each sub-code using an LDPC iterative decoder corresponding to A, and if at least one of the sub-codes does not converge, then decoding continues, using an LDPC decoder associated with the full matrix B.

The minimal requirement for the matrix M is to have at least two copies of a parity-check matrix A of a sub-code in the diagonal sub-matrix structure, and to have at least one row corresponding to the matrices $B_i$, containing an element $b_{n1}$ that has a value 1 and is positioned in column $n_1$, and an element $b_{n2}$ that has a value 1 and is positioned in column $n_2$, wherein the columns $n_1$ and $n_2$ are associated with two different copies of the matrix A. At least one of the matrices $B_i$ must be different from the other matrices $B_i$. Note that not all copies of matrix A have to be identical, even though identical copies of A is the best mode in order to be able to use the same decoder for all sub-codes. However it also is possible for there to be variations in the sub-codes, i.e. one sub-code could be different than another. One such case is when there are areas in a flash memory with slightly higher reliability and other areas with slightly lower reliability.

For example, sub-code j could be slightly longer (with more parity) than sub-code k for j≠k. Such differences could also be mitigated via an interleaver however an interleaver might require more RAM and a delay in the processing. Another case is when the size of a word line of a flash memory does not perfectly match to certain integer multiple of the size of A so that one or more sub-codes have to be longer or shorter than the other sub-codes.

Preferably, the connection layer includes a plurality of connection layer sub-matrices, with each of the connection layer sub-matrices associated with the columns of one of the A matrices, and each of the sub-matrices of the connection layer having a single non-zero element in each row. The connection layer sub-matrices may be replicas of a single prototype sub-matrix, but for best performance it is better to have the columns of the non-zero elements to be chosen by a random or pseudo random process or by some other process known in the art of LDPC code design. One such approach is to have a target metric minimized/maximized. One such example is to minimize the average error rate or to maximize the minimal cycle of matrix M.

Preferably each of the matrices $B_i$ in the "connection layer" is a matrix of size $k \times c_a$ having the form:

$$B_i = [I_k 0_{k,c_a-k}] Q_{c_a} \quad (6)$$

where the number of rows of the connection layer is k, $I_k$ is the identity matrix of size k×k, the number of columns of the matrix A is $c_a$, $0_{k,c_a-k}$ is a zero matrix of size k×($c_a$-k), and the concatenation of $I_k$ and $0_{k,c_a-k}$ is right-multiplied by $Q_{c_a}$, a (pseudo) random permutation matrix of size: $c_a \times c_a$, (permutation matrices are defined below). The purpose of this structure of $B_i$ is to exclude some of the bit nodes of the sub-code of $A_i$ from the connection via the connection layer to the other sub-codes. Specifically, $c_a$-k such bit nodes, out of the $C_a$ bit nodes of the sub-code of $A_i$, are excluded from the connection to the other sub-codes.

With this type of matrices $B_i$, the long LDPC code represented by the full matrix M has the full performance expected from an LDPC code whose size is the number of columns of M.

Another prototype parity check matrix for the encoding scheme described herein is of the following form:

$$M = \begin{bmatrix} A & & & & | & 0 \\ & A & & & | & 0 \\ & & \ddots & & | & \vdots \\ & & & A & | & 0 \\ B_1 & B_2 & \cdots & B_n & | & B_{n+1} \end{bmatrix} \quad (7)$$

Similar to the first prototype, the matrix A is a parity-check matrix for a sub-code including only a subset of the variables of the code, and the last rows of the matrix M (those corresponding to the matrices $B_i$), contain parity check equations involving variable bits associated with different sub-codes. In addition, in this prototype, the columns corresponding to the sub-matrix $B_{n+1}$ are associated with variable bits which are not involved in any of the sub-codes associated with the multiple copies of the matrix A. In some embodiments, matrix $B_{n+1}$ is the identity matrix. Note that $B_{n+1}$ is defined herein as the entire part of the connection layer that is not below any A matrices.

A decoder for the code represented by the matrix M of equation (7) may first check the parity conditions corresponding to each sub-code by applying a low-complexity decoder to each sub-code. In case some of the sub-codes do not converge in a predefined number of iterations, or if it is estimated that the number of errors is too high for the low complexity decoders to converge, additional decoding may be applied taking into account the relations between the sub-codes defined by the last rows of M. As in the first prototype, these last rows of M are referred to as the "connection layer" of the code and, in the appended claims as the "connection layer" of matrix M. The portion of matrix M above the connection layer is referred to in the appended claims as a "diagonal sub-matrix structure". The matrices A are referred to in the appended claims as "diagonal structure sub-matrices".

Preferably, in the prototype of equation (7) the elements of the matrices $B_i$ for i=1, 2, ..., n are non-zero only in predefined columns of the matrix M. In typical examples these predefined columns are associated with punctured variable bits, i.e. with variable bits corresponding to parity bits which are computed during encoding but are not exported, for example by being stored in the flash memory (for memory storage applications) or by being transmitted over the channel (in communication applications). The variables associated with the columns of the last sub-matrix $B_{n+1}$ preferably are not punctured.

The prototype parity check matrices M of equations (5) and (7) are referred to in the appended claims as "modular code matrices".

In yet another embodiment, we note that a permutation of the columns of the matrix M does not change the parity-check matrix in a fundamental way, but only changes the enumeration of the bit variables. Similarly, permuting the rows of the matrix M changes the order of the parity-check equations, but does not change any of the equations themselves. Therefore, codes equivalent to the codes defined by the parity-check matrix M of equations (5) and (7) are defined by a parity-check matrix that is a result of applying row permutations and column permutations on M. These codes can also be decoded by similar low-complexity methods as the code defined by M.

A parity-check matrix that is a result of applying row permutations and column permutations to M can be expressed as a matrix H satisfying:

$$H = R \cdot M \cdot Q \quad (8)$$

where R and Q are permutation matrices. A permutation matrix R is a square matrix that is a result of applying a permutation on the rows of the identity matrix I (with the same dimensions as R).

If R is a permutation $r_1$ of the rows of an identity matrix I, then there exists a permutation $r_2$ (possibly different from $r_1$) such that R is a permutation $r_2$ of the columns of the identity matrix I.

Left-multiplying any matrix M with the same number of rows as R by R is equivalent to applying the permutation $r_1$ to the rows of M, while right-multiplying any matrix M with the same number of columns as R by R is equivalent to applying the permutation $r_2$ to the columns of M.

Therefore, the most general form of a matrix, which is a result of applying row and column permutations to the matrix M, is $H=R \cdot M \cdot Q$, where R and Q are permutation matrices.

In yet another embodiment, we note that if M is a parity-check matrix for some linear block code, then $M'=RM$ mod (2) is also a parity check matrix for the same code if and only if R is an invertible matrix over the field GF(2), wherein such an invertible matrix may be described as a matrix whose elements are either 1 or 0, and whose determinant (computed over the integers) is odd (non-even).

The embodiment of equation 8 may be extended to include also all matrices of the form:

$$H=R \cdot M \cdot Q \bmod(2) \quad (9)$$

where R is any invertible matrix over GF(2).

Note that for an invertible matrix M, the set of all matrices of the form $M'=R \cdot M \cdot Q \bmod(2)$ is the same as the set of all invertible matrices over GF(2). In general, the set of matrices of the form $M'=R \cdot M \bmod(2)$, where R is any invertible matrix over GF(2), is in one-to-one correspondence with the vector space spanned by the rows of M.

Similarly, the set of matrices of the form $H=R \cdot M \cdot Q \bmod(2)$ is in one-to-one correspondence with the set of all vector spaces that can be computed from the vector space spanned by the rows of M by permutation of the coordinates.

Note that permutation matrices are invertible matrices. In fact, if Q is a permutation matrix then there is a positive integer n such that the inverse of Q is $Q^n$. In equation (8) both R and Q are permutation matrices. In equation (9) the only restriction on R is that it be invertible, because as long as R is invertible, if H is a parity-check matrix for a certain code then RH is a parity check matrix for the same code. The reason is that a code is a linear space and performing linear operations on a linear space does not change the space. Left-multiplication of a parity-check matrix by an invertible matrix, even if the invertible matrix is not a permutation matrix, maintains the linear space, so that any codeword in a code defined by H also is a codeword in a code defined by RH if R is invertible. Note that if R is invertible then R is necessarily square and the linear operations consist of summing rows in H and selecting the target row of the summation in H. By contrast, right-multiplying a parity-check matrix by an invertible matrix other than a permutation matrix may change the code to a non-equivalent code. Nevertheless, the code associated with a parity-check matrix that has been right-multiplied by a permutation matrix may be considered equivalent (in a broad sense) to the code associated with the original parity-check matrix because the new code may be derived from the old code by a permutation of the bits.

In another embodiment, the parity-check matrix H defined in the previous section is embedded in a larger matrix H'.

We say that H is embedded in H' if H can be derived from H' by deleting one or more rows and/or one or more columns of H'.

If H is embedded in H', then in the code defined by H' there exists a sub-code which can be decoded by the low complexity methods described above, and the decoding of the sub-code may be helpful in decoding the full code by low complexity methods.

Thus, low-complexity block codes may be defined by a parity-check matrix H' that is equivalent to one of the prototype parity-check matrices defined above, either the prototype parity-check matrix M of equation (5) or the prototype parity-check matrix M of equation (7). That H' is "equivalent" to M means that either H' has embedded within itself a matrix H as defined in terms of M by either equation (8) or equation (9) or H' is identical to such a matrix H. Note that as a special case of equation (8) with R and Q equal to identity matrices, M is equivalent to itself.

Figure 3:
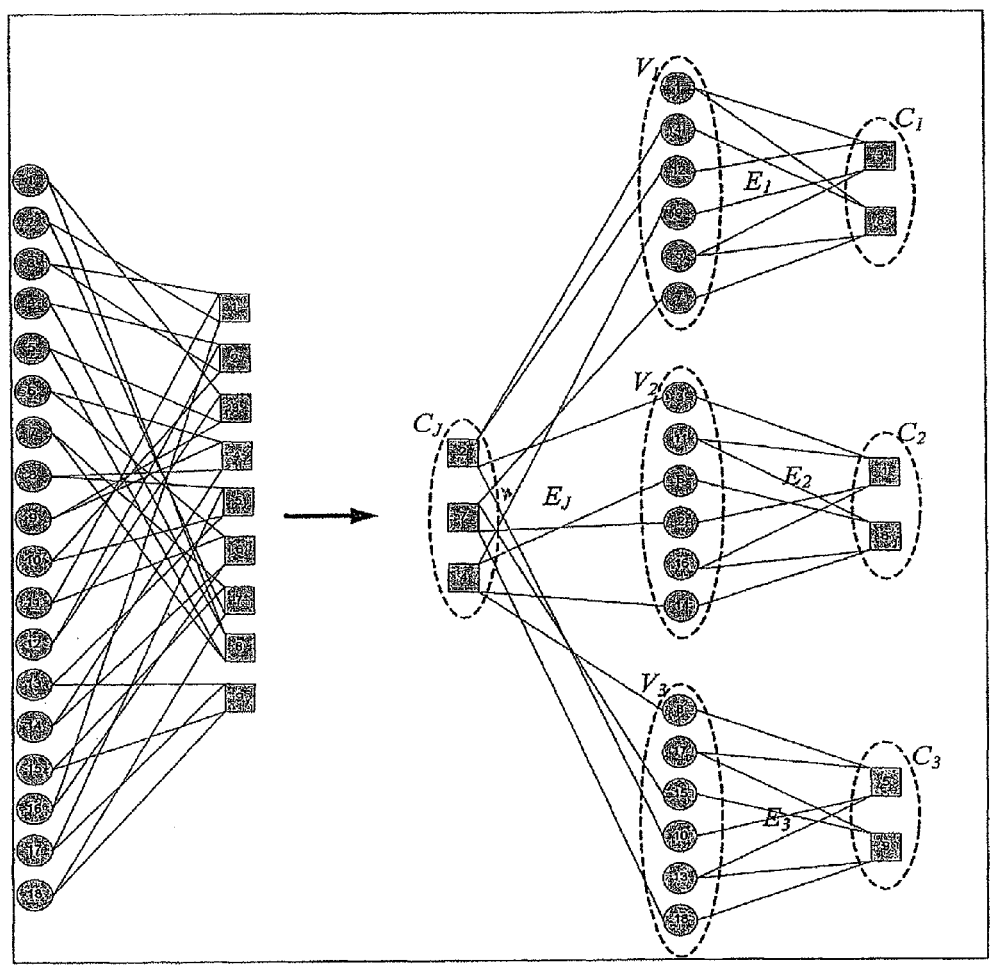
FIGS. 3 and 5 show exemplary Tanner graphs.

Returning now to the drawings, FIG. 3 shows, on its left side, a Tanner graph of a length 18, rate 1/2 LDPC code. This Tanner graph has 18 bit nodes and 9 check nodes. Each bit node is connected to two check nodes. Each check node is connected to four bit nodes. On the right side of FIG. 3, this Tanner graph has been rearranged to show its correspondence to the modular code matrix form of equation (5). The bit nodes have been grouped into three groups, $V_1$, $V_2$ and $V_3$ of six bit nodes each. Each bit node group is connected by edges to a respective group of two check nodes: bit node group $V_1$ is connected to check node group $C_1$, bit node group $V_2$ is connected to check node group $C_2$ and bit node group $V_3$ is connected to check node group $C_3$. The three bit node groups also are connected by edges to a common group $C_J$ of three check nodes. FIG. 4 shows the corresponding modular code matrix M, with the columns labeled by the corresponding bit nodes and the rows labeled by the corresponding check nodes. In FIG. 4, the matrix elements of the diagonal structure sub-matrices and of the connection layer sub-matrices are shown in bold font. All three diagonal structure sub-matrices $A_1$, $A_2$ and $A_3$ are identical. The three connection layer sub-matrices $B_1$, $B_2$ and $B_3$ are all different.

The code corresponding to the Tanner graph of FIG. 3 has nine information bits and nine parity bits per codeword. The Tanner graph itself does not define uniquely which bits are information bits and which bits are parity bits. One such definition associates bit nodes $V_1$, $V_5$, $V_4$, $V_{11}$, $V_{16}$, $V_6$, $V_{17}$, $V_{13}$ and $V_{15}$ with information bits and bit nodes $V_{12}$, $V_9$, $V_7$, $V_3$, $V_2$, $V_{14}$, $V_8$, $V_{10}$ and $V_{18}$ with parity bits. The codeword then is $(v_1, v_5, v_4, v_{11}, v_{16}, v_6, v_{17}, v_{13}, v_{15}, v_{12}, v_9, v_7, v_3, v_2, v_{14}, v_8, v_{10}, v_{18})$ where each $v_i$ is a bit of the codeword, labeled by its corresponding bit node in the Tanner graph of FIG. 3. With the bits arranged in this manner, with the parity bits following the information bits as is conventional, the actual parity-check matrix is $$H=M \cdot Q \quad (10)$$

where M is the matrix of FIG. 4 and Q is a permutation matrix that re-orders the codeword bits to match the column ordering of the above codeword vector. It is not necessary to store all eighteen bits of the codeword in the case of the codeword being stored in a memory, or to transmit all eighteen bits of the codeword in the case of the codeword being transmitted via a communication channel. For example, if parity bits $v_7$, $v_{14}$ and $v_{18}$ are omitted (a process conventionally called "puncturing"; the codeword: parity bits $v_7$, $v_{14}$ and $v_{18}$ then would be "punctured" bits), the decoding most likely will be able to decode the codeword as programmed in a flash memory just based on the other six parity bits stored in the flash memory. The initial values in the decoding of the LLRs associated with the punctured bits would be 0.

The parity-check matrix H of equation (10) also can be considered to be the parity-check matrix H of equation (8) or equation (9) in the special case of the matrix R being an identity matrix.

Figure 5:
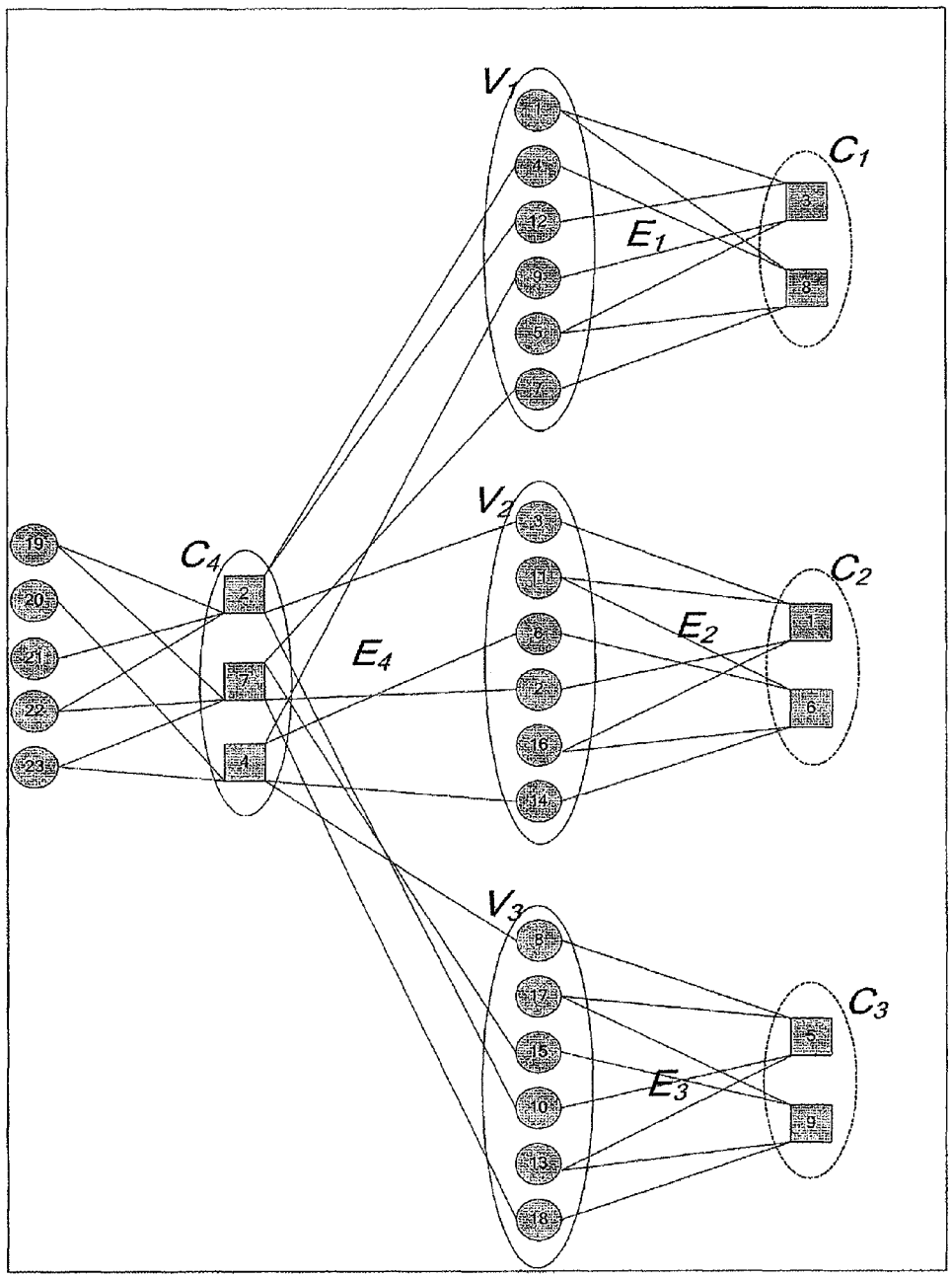

FIG. 5 shows another Tanner graph, of 23 bit nodes and 9 check nodes, whose corresponding modular code matrix is of the form of equation (7), as shown in FIG. 6. As in the case of the matrix of FIG. 4, the matrix elements of the diagonal structure sub-matrices and of the connection layer sub-matrices are shown in bold font. All three diagonal structure sub-matrices $A_1$, $A_2$ and $A_3$ are identical. The four connection layer sub-matrices $B_1$, $B_2$, $B_3$ and $B_4$ are all different.

As discussed above, the matrix structures of FIGS. 4 and 6 are amenable to low-complexity decoding. With suitably defined information bits and parity bits, the matrix structure of FIG. 6 also is amenable to low-complexity encoding. The Tanner graph of FIG. 5 has 23 bit nodes and nine check nodes, so the associated code must have fourteen information bits and nine parity bits. Let the bit nodes $V_1$, $V_5$, $V_4$, $V_{12}$, $V_{11}$, $V_{16}$, $V_6$, $V_3$, $V_{17}$, $V_{13}$, $V_{15}$, $V_8$, $V_{19}$, and $V_{21}$ be associated with information bits and the bit nodes $V_9$, $V_7$, $V_2$, $V_{14}$, $V_{10}$, $V_{18}$, $V_{20}$, $V_{22}$ and $V_{23}$ be associated with parity bits. The corresponding codeword, reordered in the conventional manner, is $(v_1, v_5, v_4, v_{12}, v_{11}, v_{16}, v_6, v_3, v_{17}, v_{13}, v_{15}, v_8, v_{19}, v_9, v_7, v_2, v_{14}, v_{10}, v_{18}, v_{21}, v_{22}, v_{23}, v_{20})$ The matrix structure of FIG. 6 uncouples the parity bits in a way that reduces the solution of equation (4) from one set of nine equations in nine unknowns to three sets of two equations in two unknowns and one set of three equations in three unknowns. Noting that $$A_1 = A_2 = A_3 = A = \begin{bmatrix} 1 & 1 & 0 & 1 & 1 & 0 \\ 1 & 1 & 1 & 0 & 0 & 1 \end{bmatrix} \quad (11)$$

the equations to solve for the parity bits $v_9$, $v_7$, $v_2$, $v_{14}$, $v_{10}$ and $v_{18}$ are:

$$A \begin{bmatrix} v_1 \\ v_5 \\ v_4 \\ v_{12} \\ v_9 \\ v_7 \end{bmatrix} = 0 \quad (12a)$$

$$A \begin{bmatrix} v_{11} \\ v_{16} \\ v_6 \\ v_3 \\ v_2 \\ v_{14} \end{bmatrix} = 0 \quad (12b)$$

$$A \begin{bmatrix} v_{17} \\ v_{13} \\ v_{15} \\ v_8 \\ v_{10} \\ v_{18} \end{bmatrix} = 0 \quad (12c)$$

With the first six parity bits solved for, the remaining three parity bits are found using the connection layer.

Removing, from the Tanner graph of FIG. 5, the edge connecting bit node 4 to check node 2, the edge connecting bit node 6 to check node 4 and the edge connecting bit node 15 to check node 7, gives a Tanner graph whose corresponding modular code matrix is shown in FIG. 11. The three leftmost connection layer sub-matrices are of the form of equation (6) with $Q_{c_a}$ for $B_1$, $B_2$ and $B_3$ being $$\begin{pmatrix} 0 & 0 & 0 & 1 & 0 & 0 \\ 0 & 0 & 0 & 0 & 0 & 1 \\ 0 & 0 & 0 & 0 & 1 & 0 \\ 1 & 0 & 0 & 0 & 0 & 0 \\ 0 & 1 & 0 & 0 & 0 & 0 \\ 0 & 0 & 1 & 0 & 0 & 0 \end{pmatrix}$$

$$\begin{pmatrix} 0 & 0 & 0 & 1 & 0 & 0 \\ 0 & 0 & 0 & 0 & 1 & 0 \\ 0 & 0 & 0 & 0 & 0 & 1 \\ 1 & 0 & 0 & 0 & 0 & 0 \\ 0 & 1 & 0 & 0 & 0 & 0 \\ 0 & 0 & 1 & 0 & 0 & 0 \end{pmatrix}$$

and $$\begin{pmatrix} 0 & 0 & 0 & 0 & 1 & 0 \\ 0 & 0 & 0 & 0 & 0 & 1 \\ 0 & 0 & 0 & 1 & 0 & 0 \\ 1 & 0 & 0 & 0 & 0 & 0 \\ 0 & 1 & 0 & 0 & 0 & 0 \\ 0 & 0 & 1 & 0 & 0 & 0 \end{pmatrix}$$

respectively. The modular code matrix of FIG. 11 connects only parity bits of different sub-codes via the connection layer, unlike the modular code matrix of FIG. 6 that also connects information bits of different sub-codes via the connection layer.

Figure 7:
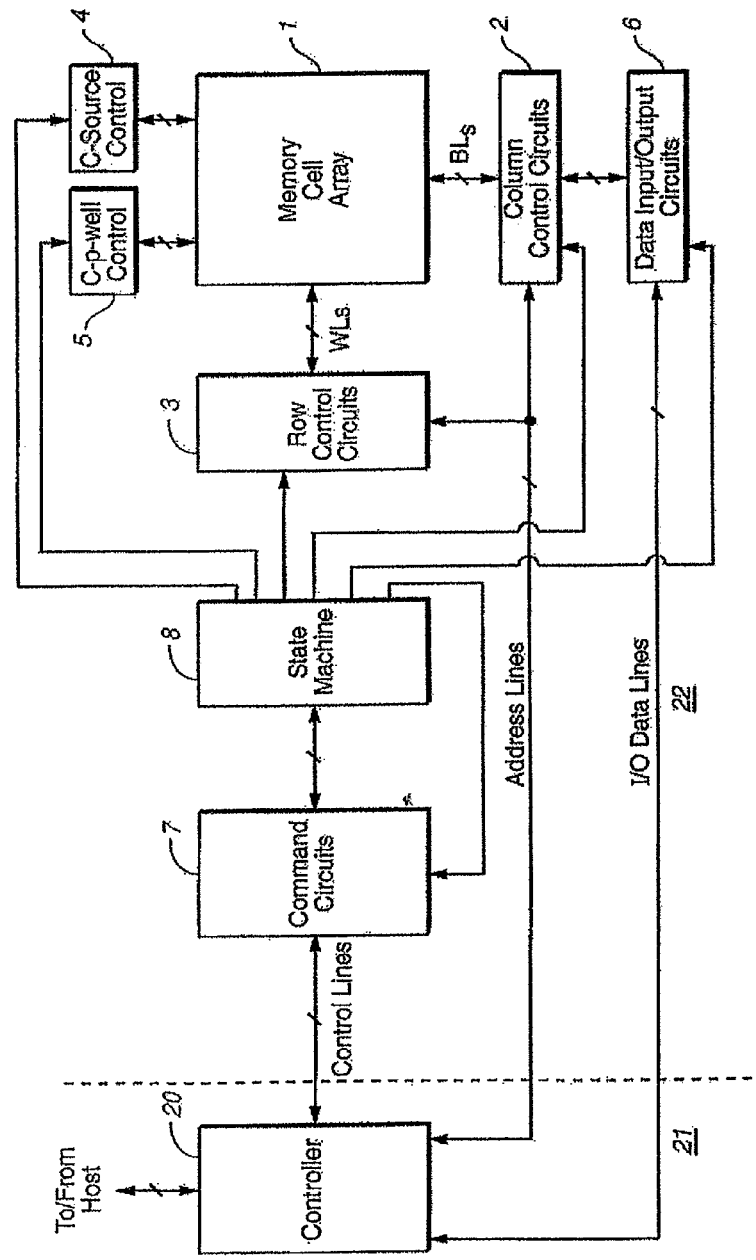
FIG. 7 is a high-level schematic block diagram of a flash memory device whose controller uses a parity-check matrix that is equivalent to a modular code matrix for encoding and decoding.

FIG. 7 is a high-level schematic block diagram of a flash memory device. A memory cell array 1 including a plurality of memory cells M arranged in a matrix is controlled by a column control circuit 2, a row control circuit 3, a c-source control circuit 4 and a c-p-well control circuit 5. Column control circuit 2 is connected to bit lines (BL) of memory cell array 1 for reading data stored in the memory cells (M), for determining a state of the memory cells (M) during a programming operation, and for controlling potential levels of the bit lines (BL) to promote the programming or to inhibit the programming. Row control circuit 3 is connected to word lines (WL) to select one of the word lines (WL), to apply read voltages, to apply programming voltages combined with the bit line potential levels controlled by column control circuit 2, and to apply an erase voltage coupled with a voltage of a p-type region on which the memory cells (M) are formed. C-source control circuit 4 controls a common source line connected to the memory cells (M). C-p-well control circuit 5 controls the c-p-well voltage.

The data stored in the memory cells (M) are read out by column control circuit 2 and are output to external I/O lines via an I/O line and a data input/output buffer 6. Program data to be stored in the memory cells are input to data input/output buffer 6 via the external I/O lines, and are transferred to column control circuit 2. The external I/O lines are connected to a controller 20.

Command data for controlling the flash memory device are input to a command interface connected to external control lines which are connected with controller 20. The command data inform the flash memory of what operation is requested. The input command is transferred to a state machine 8 that controls column control circuit 2, row control circuit 3, c-source control circuit 4, c-p-well control circuit 5 and data input/output buffer 6. State machine 8 can output a status data of the flash memory such as READY/BUSY or PASS/FAIL.

Controller 20 is connected or connectable with a host system such as a personal computer, a digital camera, a personal digital assistant. It is the host which initiates commands, such as to store or read data to or from the memory array 1, and provides or receives such data, respectively. Controller 20 converts such commands into command signals that can be interpreted and executed by command circuits 7. Controller 20 also typically contains buffer memory for the user data being programmed to or read from the memory array. A typical memory device includes one integrated circuit chip 21 that includes controller 20, and one or more integrated circuit chips 22 that each contains a memory array and associated control, input/output and state machine circuits. The trend, of course, is to integrate the memory array and controller circuits of such a device together on one or more integrated circuit chips. The memory device may be embedded as part of the host system, or may be included in a memory card that is removably insertable into a mating socket of host systems. Such a card may include the entire memory device, or the controller and memory array, with associated peripheral circuits, may be provided in separate cards.

Figure 8:
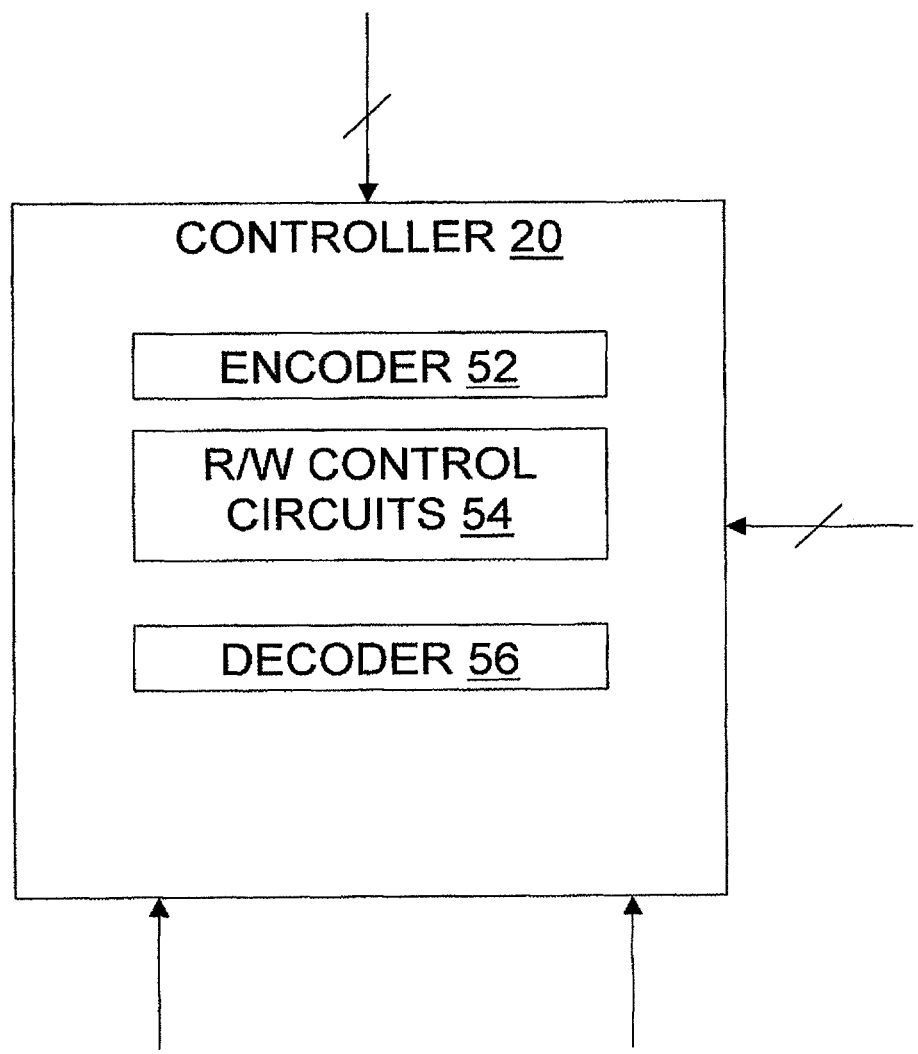
FIG. 8 shows details of the controller of FIG. 7.

FIG. 8 is an enlarged view of controller 20 of FIG. 7, showing that controller 20 includes an encoder 52 for encoding user data received from the host as described above, circuitry 54 for instructing command circuits 7 to store the codewords in memory cell array 1 and for instructing command circuits 7 to retrieving the stored codewords from memory cell array 1, and a decoder 56 for decoding the codewords as retrieved by circuitry 54. As is known in the art, controller 20 could be implemented in hardware, firmware, software or any combination thereof.

Figure 9:
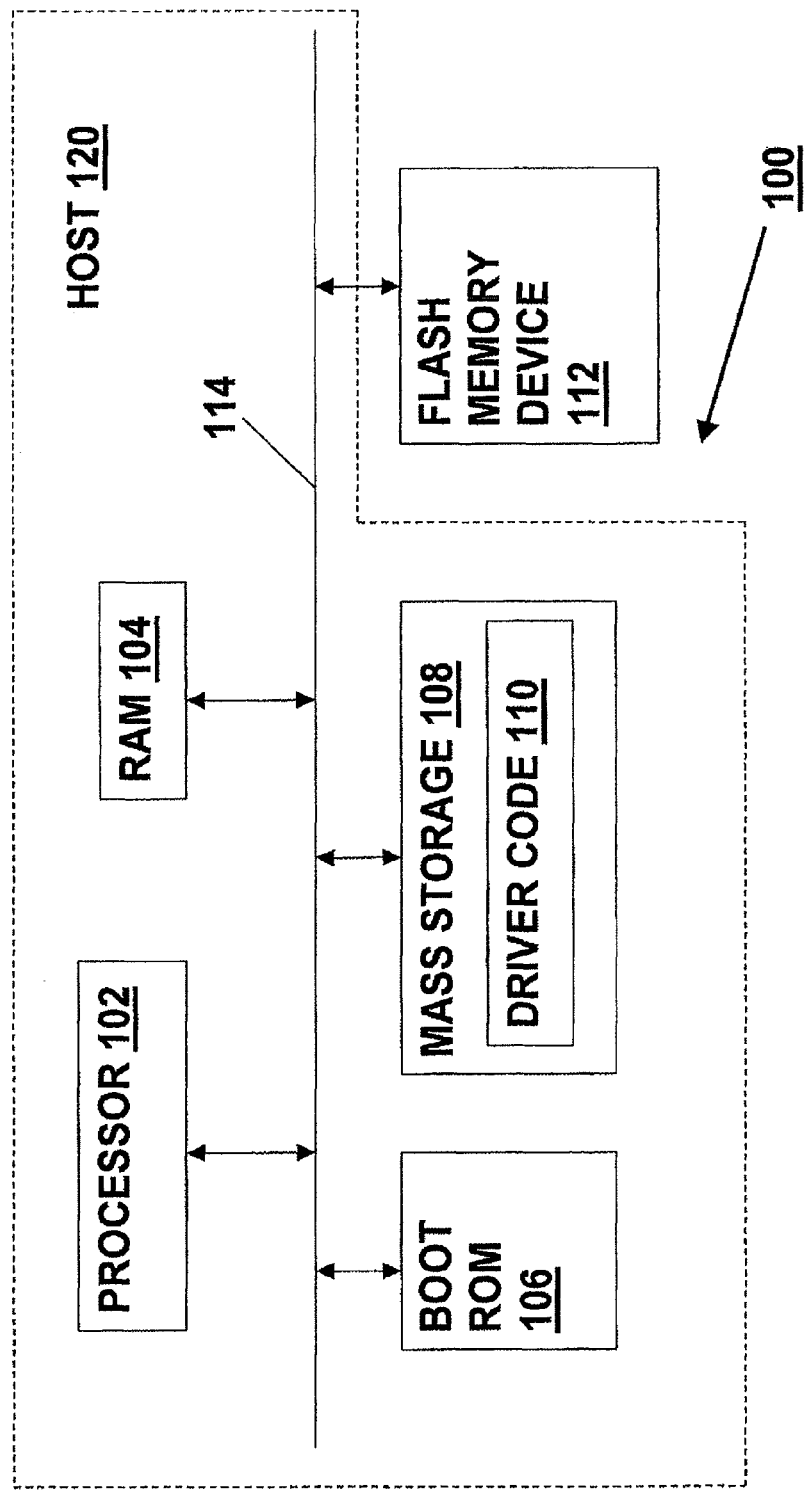
FIG. 9 is a high-level schematic block diagram of a memory system in which most of the functionality of the controller of FIG. 7 is emulated by software.

FIG. 9 is a high-level block diagram of a system 100 in which most of the functionality of controller 20 is effected by software. System 100 includes a processor 102 and four memory devices: a RAM 104, a boot ROM 106, a mass storage device (hard disk) 108 and a modified flash memory device of FIG. 7 as a flash memory device 112, all communicating via a common bus 114. The difference between the flash memory device of FIG. 7 and flash memory device 112 is that the controller of flash memory device 112 functions only as an interface to bus 114; the rest of the functionality of controller 20 of FIG. 7 as described above is emulated by flash memory driver software code 110 that is stored in mass storage device 108 and that is executed by processor 102 to interface between user applications executed by processor 102 and flash memory device 112, and to manage the flash memory of flash memory device 112. In addition to the conventional functionality of such flash management driver code, driver software code 110 emulates the functionality of controller 20 of FIG. 7 with respect to encoding and decoding of codewords that are stored in memory cell array 1 and that are read from memory cell array 1, as described above. Driver software code 110 typically is included in operating system code for system 100 but also could be freestanding code.

The components of system 100 other than flash memory device 112 constitute a host 120 of flash memory device 112. Mass storage device 108 is an example of a computer-readable storage medium bearing computer-readable driver software code for encoding and decoding codewords as described above. Other examples of such computer-readable storage media include read-only memories such as CDs bearing such code.

Figure 10:
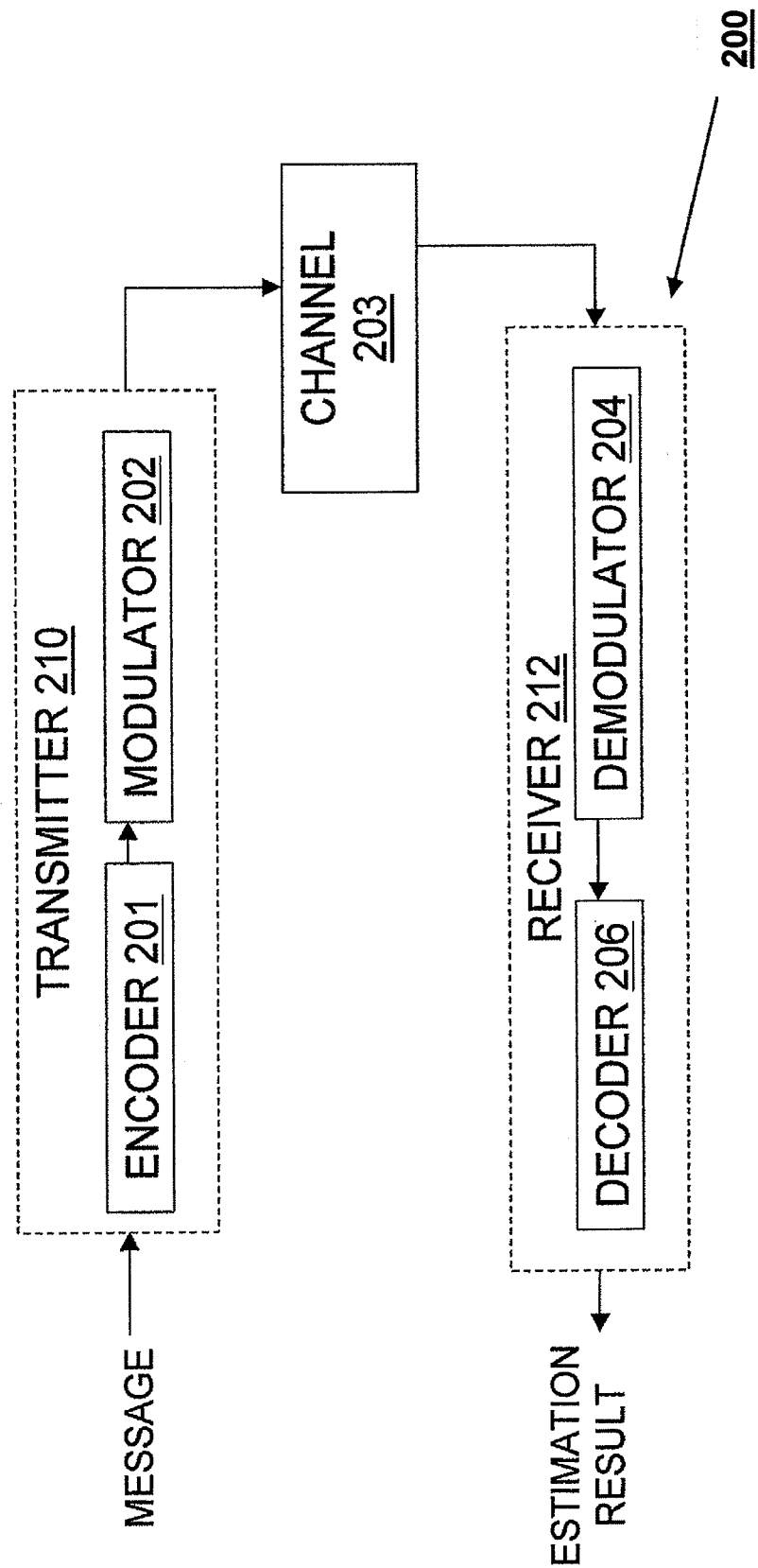
FIG. 10 is a high-level schematic block diagram of a communication system whose transmitter uses parity-check matrix that is equivalent to a modular code matrix for encoding and whose receiver uses the same parity-check matrix for decoding.

FIG. 10 is a high-level schematic block diagram of a communication system 200 that includes a transmitter 210, a channel 203 that serves as a transmission medium, and a receiver 212. Transmitter 210 includes an encoder 201 and a modulator 202. Receiver 212 includes a demodulator 204 and a decoder 206. Encoder 201 receives a message and generates a corresponding codeword as described above. Modulator 202 subjects the generated codeword to a digital modulation such as BPSK, QPSK or multi-valued QAM and transmits the resulting modulated signal to receiver 212 via channel 203. At receiver 212, demodulator 204 receives the modulated signal from channel 203 and subjects the received modulated signal to a digital demodulation such as BPSK, QPSK or multi-valued QAM. Decoder 206 decodes the resulting received codeword as described above. Like controller 20, encoder 201 and decoder 206 could be implemented in hardware, firmware, software or any combination thereof.

A limited number of embodiments of methods, devices and systems for low-complexity encoding and decoding have been described. It will be appreciated that many variations, modifications and other applications of the methods, devices and systems may be made.

What is claimed is:

1. A method of encoding and exporting a plurality of information bits, comprising:
    (a) providing a parity-check matrix that is equivalent to a modular code matrix that consists of a diagonal sub-matrix structure, including a plurality of diagonal structure sub-matrices, immediately above a connection layer that includes a plurality of contiguous diverse connection layer sub-matrices that have the same number of rows, with all but at most one of the connection layer sub-matrices being below corresponding diagonal structure sub-matrices;
    (b) using the information bits and the parity-check matrix to compute, via an encoder, a plurality of parity bits;
    (c) assembling, via the encoder, the information bits and the parity bits to form a codeword; and
    (d) exporting at least a portion of the codeword to a medium.

2. The method of claim 1, wherein all the diagonal structure sub-matrices are identical.

3. The method of claim 1, wherein a number of non-zero elements in each diagonal structure sub-matrix is at most a predefined fraction of a number of elements of the each diagonal structure sub-matrix.

4. The method of claim 1, wherein only at least a portion of the diagonal structure sub-matrices are used to compute a portion of the parity bits.

5. The method of claim 4, wherein each diagonal structure sub-matrix of the at least portion of the diagonal structure sub-matrices is used separately to compute only a respective at least one of the parity bits.

6. The method of claim 1, wherein each connection layer sub-matrix is below a corresponding diagonal structure sub-matrix.

7. The method of claim 1, wherein every connection layer sub-matrix except for a rightmost connection layer sub-matrix is below a corresponding diagonal structure sub-matrix.

8. The method of claim 1, wherein each connection layer sub-matrix is of the form [IZ]Q, where I is an identity matrix, Z is a zero matrix and Q is a pseudorandom permutation matrix.

9. The method of claim 1, wherein the connection layer sub-matrices have non-zero elements only in pre-defined columns of the modular code matrix.

10. The method of claim 9, wherein the pre-defined columns correspond to at least a portion of the parity bits.

11. The method of claim 10, wherein the pre-defined columns correspond to only a portion of the parity bits, and wherein all of the codeword except the portion of the parity bits is exported to the medium.

12. The method of claim 1, wherein the parity check matrix is identical to the modular code matrix.

13. The method of claim 1, wherein the parity check matrix is the modular code matrix left-multiplied by an invertible matrix and right-multiplied by a first permutation matrix.

14. The method of claim 13, wherein the invertible matrix is a second permutation matrix.

15. The method of claim 13, wherein the modular code matrix is embedded in the parity-check matrix.

16. An apparatus for encoding and exporting a plurality of information bits, comprising:
  (a) an encoder for encoding the plurality of information bits by:
    (i) using the information bits and a parity-check matrix to compute a plurality of parity bits, wherein the parity-check matrix is equivalent to a modular code matrix that consists of a diagonal sub-matrix structure, including a plurality of diagonal structure sub-matrices, immediately above a connection layer that includes a plurality of contiguous diverse connection layer sub-matrices that have the same number of rows, with all but at most one of the connection layer sub-matrices being below corresponding diagonal structure sub-matrices, and
    (ii) assembling the information bits and the parity bits to form a codeword; and
  (b) a mechanism for exporting at least a portion of the codeword to a medium.

17. The apparatus of claim 16, wherein the medium is a storage medium.

18. The apparatus of claim 17, wherein the apparatus is a controller of the storage medium.

19. The apparatus of claim 17, wherein the apparatus is a host of the storage medium.

20. The apparatus of claim 16, wherein the medium is a transmission medium.

21. A transmitter comprising the apparatus of claim 20.

22. The transmitter of claim 21, wherein the mechanism includes a modulator that transmits the at least portion of the codeword as a modulated signal.

23. A memory device comprising:
  (a) the apparatus of claim 18; and
  (b) the storage medium of claim 18.

24. A system comprising:
  (a) the apparatus of claim 19; and
  (b) the storage medium of claim 19.

25. A non-transitory computer-readable storage medium having embodied thereon computer-readable code for managing a memory, the computer-readable code comprising:
  (a) program code for using a parity-check matrix to compute a plurality of parity bits, wherein the parity-check matrix is equivalent to a modular code matrix that consists of a diagonal sub-matrix structure, including a plurality of diagonal structure sub-matrices, immediately above a connection layer that includes a plurality of contiguous diverse connection layer sub-matrices that have the same number of rows, with all but at most one of the connection layer sub-matrices being below corresponding diagonal structure sub-matrices;
  (b) program code for assembling the information bits and the parity bits to form a codeword; and
  (c) program code for storing the codeword in the memory.

26. A system comprising:
  (a) a memory; and
  (b) a host, of the memory, that includes:
    (i) the computer-readable storage medium of claim 25, and
    (ii) a processor for executing the computer-readable code.

* * * * *